United States Patent [19]

Kida

[11] Patent Number: 5,256,243
[45] Date of Patent: Oct. 26, 1993

[54] PROCESS FOR PRODUCING TITANIUM CARBIDE WHISKER

[75] Inventor: Tohru Kida, Gotenba, Japan

[73] Assignee: Tokai Carbon Co., Ltd., Tokyo, Japan

[21] Appl. No.: 790,321

[22] Filed: Nov. 12, 1991

[30] Foreign Application Priority Data

Nov. 26, 1990 [JP] Japan .................................. 2-323866

[51] Int. Cl.$^5$ ............................................. C01B 21/06
[52] U.S. Cl. .................................... 156/603; 156/610; 156/611; 156/613; 156/DIG. 68; 156/DIG. 75; 156/DIG. 112; 423/439
[58] Field of Search ............... 156/603, 610, 611, 613, 156/DIG. 68, DIG. 75, DIG. 112; 423/439

[56] References Cited

U.S. PATENT DOCUMENTS

| | | | |
|---|---|---|---|
| 2,792,310 | 5/1957 | Steinberg et al. | 423/439 |
| 3,840,647 | 10/1974 | Tomita et al. | 156/DIG. 112 |
| 4,883,559 | 11/1989 | Bamberger | 156/603 |
| 4,888,084 | 12/1989 | Nixdorf et al. | 156/603 |
| 4,900,525 | 2/1990 | D'Angelo et al. | 156/DIG. 99 |
| 4,948,575 | 8/1990 | Nadkarni et al. | 423/439 |

FOREIGN PATENT DOCUMENTS

9014451 11/1990 PCT Int'l Appl. ........ 156/DIG. 112

*Primary Examiner*—Olik Chaudhuri
*Assistant Examiner*—Felisa Garrett
*Attorney, Agent, or Firm*—Armstrong, Westerman, Hattori, McLeland & Naughton

[57] ABSTRACT

A process for producing a titanium carbide whisker, comprising the steps of: mixing 100 parts by weight of a titanium source comprising titanium dioxide and/or an alkali metal titanate with 50 to 200 parts by weight of a carbon source and 1 to 30 parts by weight of a transition metal chloride; and heating the resultant mixture at 1300° to 1700° C. in an inert gas atmosphere.

3 Claims, No Drawings

PROCESS FOR PRODUCING TITANIUM CARBIDE WHISKER

BACKGROUND OF THE INVENTION

The present invention relates to a process for producing a titanium carbide (TiC) whisker from solid raw materials.

As with other ceramic whiskers, an acicular crystal of titanium carbide, that is, a titanium carbide whisker, has a high level of mechanical strength, heat resistance, chemical stability and other properties.

In particular, since the hardness is very excellent, the titanium carbide whisker has attracted attention, for example, as a composite material and a cermet material for carbide tools.

Examples of the process for producing the titanium carbide whisker known in the art include one wherein a titanium halide is reacted with carbon monoxide (see Japanese patent application Kokai publication No. 58-60700 and one wherein a titanium halide is reacted with carbon tetrachloride (see Z. Wokulski, Journal of Crystal Growth, 82 (1987), 427–434).

In these processes, vaporous or gaseous feedstock components are led on a heated substrate through the use of hydrogen gas as a carrier gas to form a titanium carbide whisker on the substrate.

In these processes, however, since hydrogen gas which is highly liable to leak is used as the carrier gas, it is impossible to avoid the risk of explosion during the operation and, at the same time, it is difficult to conduct continuous production, which renders the above-described processes very disadvantageous as a process for mass-producing a titanium carbide whisker.

SUMMARY OF THE INVENTION

A first object of the present invention is to provide a process for producing a titanium carbide whisker from a solid material without the use of hydrogen.

A second object of the present invention is to provide a process for producing a titanium carbide whisker which enables the titanium carbide whisker to be mass-produced.

A third object of the present invention is to provide a process for producing a titanium carbide whisker less susceptible to bending and ramification.

The above objects of the present invention can be attained by mixing 100 parts by weight of a titanium source comprising titanium dioxide and/or an alkali metal titanate with 50 to 200 parts by weight of a carbon source and 1 to 30 parts by weight of a transition metal chloride and heating the resultant mixture at 1300° to 1700° C. in an inert gas atmosphere.

DETAILED DESCRIPTION OF THE PREFERRED EMBODIMENTS

In the process for producing titanium carbide according to the present invention, powdery titanium dioxide and alkali metal titanates, such as powdery or whiskered potassium titanate and sodium titanate are used alone or in the form of a mixture thereof. Examples of the carbon source include various carbonaceous powders such as carbon powder, graphite powder, activated carbon powder and carbon black. It is preferred to use a carbon black having a large specific surface area.

Further, in the process of the present invention, chlorides of transition metals, that is, iron, nickel and cobalt, are used alone or in the form of a mixture thereof. The transition metal chloride functions as a catalyst for promoting the formation of a titanium carbide whisker from the above-described titanium source and carbon source, and in the case of transition metal compounds other than the chloride, the catalytic effect is poor.

100 parts by weight of the titanium source is mixed with 50 to 200 parts by weight of the carbon source and 1 to 30 parts by weight of the transition metal chloride.

When the amount of the carbon source is less than 50 parts by weight, the carbonization reaction of the titanium source does not smoothly proceed. On the other hand, when the amount of the carbon source exceeds 200 parts by weight, the amount of the carbon source remaining unreacted becomes so large that the removal and separation of the unreacted carbon source in the post treatment become troublesome.

When the amount of the transition metal chloride is less than 1 part by weight, no catalytic effect can be attained, while when the amount exceeds 30 parts by weight, no further improvement in the effect can be attained.

According to the present invention, it is preferred to further add alkali metal chlorides such as potassium chloride and sodium chloride. The above-described alkali metal chlorides prevent the formed titanium carbide from powdering, which contributes to a significant improvement in the yield of the titanium carbide whisker and an enhancement in the content of the whisker which is free from bending and ramification.

Specifically, the alkali metal chloride functions as a powdering inhibitor, and the amount of addition thereof is 10 to 100 parts by weight based on 100 parts by weight of the titanium source. When the amount is less than 10 parts by weight, no powdering inhibition effect can be attained, while when the amount exceeds 100 parts by weight, no further improvement in the effect is observed.

Further, according to the present invention, the mixture prepared by mixing the above individual sources with each other is preferably lightly compressed so that it has a bulk density of 0.2 g/cm² or less and then heated. The above-described treatment prior to the heating can further prevent the formed whisker from causing bending and ramification. The above-described bulk density can be attained, for example, by filling a source mixture in a container made of a heat-resistant material, for example, graphite, and by appropriately applying a lid to the container so as to lightly pack the source mixture.

Then, the reaction container packed with the source mixture is placed in a heating oven maintained in an inert gas atmosphere, such as argon gas, and heated to a temperature of 1300° to 1700° C. to react the titanium source with the carbon source. The heating time is governed by the heating temperature. The higher the temperature, the shorter the heating time.

The reaction is usually completed at 1500° C. in about 2 hr.

The reaction product is taken out of the reaction container and then subjected to a post-treatment to remove the unreacted carbon source.

The post-treatment may be conducted by a method wherein the reaction product is heated in the air to burn the carbon source. This method, however, has a drawback that the titanium carbide is oxidized. For this reason, it is preferred to use a liquid phase separation method which comprises putting the reaction product into a two-phase liquid comprising an organic solvent (toluene, gas oil, kerosine or the like) and water and shaking the mixture to separate the nonhydrophilic carbon source on the side of the organic solvent phase and the hydrophilic titanium carbide on the side of the aqueous phase side.

The separated titanium carbide is filtered, dried and purified through the separation of the titanium carbide into a whisker and a powder according to the Stokes diameter difference by means of a wet cyclone or the like.

The titanium carbide whisker thus obtained is a gray acicular crystal having such an aspect value that the diameter and the length are 0.05 to 5 μm and 5 to 200 mm, respectively, and exhibits such an X-ray diffraction pattern that the diffraction lines of a TiC crystal are observed at 2.15 Å, 2.49 Å and 1.52 Å in terms of the d value.

It is believed that the formation of the titanium carbide whisker proceeds through a VLS (vapor-liquid-solid) mechanism wherein the diameter of the whisker depends upon the size of liquid droplets at the tip of growth.

Specifically, in the process of the formation of the whisker, it is conceivable that the transition metal component contained in the transition metal chloride forms an active site (a liquid phase) at the tip of the growth of the whisker while the chloride component facilitates the vaporization of the titanium component from the titanium source, and the carbon component of the carbon source and the titanium component thus vaporized give rise to solid solution at the above-described whisker growth site to form titanium carbide which grows in the form of a whisker.

When an alkali metal chloride is added to the source system, the above-described formation mechanism proceeds more effectively, which contributes to a significant increase in the proportion of the whisker in the formed titanium carbide and an improvement in the properties of the whisker.

As a result, according to the present invention, it becomes possible to produce a titanium carbide whisker having excellent properties in a good yield.

The present invention will now be described in more detail with reference to the following examples.

EXAMPLES 1 to 11:

Use was made of an anatase type titanium dioxide ($TiO_2$) powder (first grade reagent) and/or a commercially available potassium titanate ($K_2Ti_6O_{13}$) whisker as a titanium source, carbon black as a carbon source, anhydrous nickel chloride ($NiCl_2$) as a transition metal chloride prepared by drying nickel chloride ($NiCl_2 \cdot 6H_2O$) (guaranteed grade reagent), and sodium chloride (NaCl) (first grade reagent) as an alkali metal chloride, and these solid raw materials were mechanically mixed with each other in various mixing ratios to form homogeneous mixtures.

The mixture of individual raw materials was lightly packed into a graphite container having an internal diameter of 100 mm and a height of 50 mm and equipped with a screw cap in a packing density of 0.2 g/cc or less, the lid was closed, and the container was set in a high-frequency oven maintained in an argon gas atmosphere and heated at 1500° C. for 2 hr to allow a reaction to proceed.

The product was taken out of the reaction container, compressed by means of a press to break the sites of fusion of whiskers with themselves and put into toluene in a separatory funnel. Then, water in an amount slightly larger than the amount of toluene was added to the separatory funnel, the mixture was shaken and fractionated into two liquids, and the titanium carbide component which had migrated to the side of the aqueous phase was separated, filtered and dried.

The resultant titanium carbide was separated by means of a wet cyclone into a whisker and a powder with the boundary Stokes diameter being 10 μm.

The weight yield (yield of TiC) of the whole titanium carbide based on Ti contained in the titanium source, the weight proportion (yield of TiCw) of the titanium carbide whisker in the whole titanium carbide and the properties of the whisker are given in Table 1 together with the formulation of the raw materials.

TABLE 1

| Ex. No. | Raw materials (pts. wt.) | | | | | Yield of TiC (%) | Yield of TiCw (%) | Properties of whisker (average value) | | |
|---|---|---|---|---|---|---|---|---|---|---|
| | $TiO_2$ | $K_2Ti_6O_{13}$ | C | $NiCl_2$ | NaCl | | | diameter | length | bending/ramification |
| 1 | 100 | 0 | 50 | 10 | 0 | 80 | 11 | 0.7 | 5 | amply occurred |
| 2 | 100 | 0 | 100 | 10 | 0 | 76 | 16 | 1.0 | 10 | occurred |
| 3 | 100 | 0 | 200 | 10 | 0 | 65 | 18 | 1.0 | 15 | slightly occurred |
| 4 | 100 | 0 | 100 | 30 | 0 | 86 | 30 | 2.0 | 15 | amply occurred |
| 5 | 0 | 100 | 100 | 10 | 0 | 81 | 23 | 1.2 | 25 | occurred |
| 6 | 0 | 100 | 100 | 30 | 0 | 86 | 41 | 2.0 | 35 | occurred |
| 7 | 100 | 0 | 100 | 10 | 100 | 82 | 85 | 1.1 | 35 | slightly occurred |
| 8 | 100 | 0 | 100 | 1 | 100 | 80 | 75 | 0.2 | 10 | slightly occurred |
| 9 | 100 | 0 | 100 | 10 | 50 | 82 | 78 | 1.0 | 25 | slightly occurred |
| 10 | 100 | 0 | 100 | 10 | 10 | 82 | 55 | 0.8 | 15 | slightly occurred |
| 11 | 50 | 50 | 50 | 5 | 50 | 82 | 77 | 0.6 | 20 | occurred |

EXAMPLES 12 TO 15 AND COMPARATIVE EXAMPLES 1 AND 2

Titanium carbide was produced under the same condition as that of the Example 1, except that use was made of a mixture prepared by mixing 100 parts by weight of the same titanium dioxide powder as that of the Example 1 with 100 parts by weight of carbon black, 10 parts by weight of a transition metal chloride and 5 parts by weight of an alkali metal chloride.

The TiC yield, TiCw yield and properties of the whisker obtained in this case were given in Table 2 together with the kinds of the transition metal chloride and alkali metal chloride.

For comparison, the results of an example in the case where the titanium carbide was produced without use of any transition metal chloride are also given in Table 2.

TABLE 2

| Ex. No. | Transition metal chloride | Alkali metal chloride | Yield of TiC (%) | Yield of TiCw (%) | Properties of whisker (average value) | | |
|---|---|---|---|---|---|---|---|
| | | | | | diameter | length | bending ramification |
| Ex. 12 | $NaCl_2$ | NaCl | 82 | 78 | 1.0 | 60 | slightly occurred |
| Ex. 13 | $Fe_2Cl_3$ | NaCl | 80 | 78 | 1.2 | 30 | occurred |
| Ex. 14 | $CoCl_3$ | NaCl | 80 | 77 | 1.1 | 30 | slightly occurred |
| Ex. 15 | $NiCl_2$ | KCl | 81 | 78 | 1.0 | 50 | slightly occurred |
| Comp. Ex. 1 | — | NaCl | 64 | 0 | — | — | — |
| Comp. Ex. 2 | — | — | 90 | 0 | — | — | — |

As described above, according to the present invention, it is possible to produce a titanium cabide whisker through the use of inexpensive solid raw materials attended with no danger. In particular, when the raw materials are used in combination with an alkali metal chloride, an extended whisker having a high quality free from bending and ramification can be produced in a high yield. Further, the adoption of a method wherein a reaction container packed with raw materials is continuously fed into a heating oven enables the titanium carbide whisker to be mass-produced.

What is claimed is:

1. A process for producing a titanium carbide whisker, comprising the steps of: mixing 100 parts by weight of a titanium source comprising titanium dioxide and/or an alkali metal titanate with 50 to 22 parts by weight of a carbon source, 1 to 30 parts by weight of a transition metal chloride, and 10 to 100 parts by weight of an alkali metal chloride to produce a mixture; and heating the mixture at 1300° to 1700° C. in an inert gas atmosphere to produce a reaction product.

2. A process according to claim 1, wherein said mixture is compressed to a bulk density of 0.2 g/cm² or less before it is heated in said inert gas atmosphere.

3. A process according to claim 1, which further comprises adding the reaction product to a two-phase liquid comprising an organic solvent and an aqueous phase and shaking the mixture to separate the carbon source remaining unreacted on the side of said organic solvent phase and the formed titanium carbide on the side of the aqueous phase.

* * * * *

UNITED STATES PATENT AND TRADEMARK OFFICE
CERTIFICATE OF CORRECTION

PATENT NO. : 5,256,243
DATED : October 26, 1993
INVENTOR(S) : Tohru Kida

It is certified that error appears in the above-indentified patent and that said Letters Patent is hereby corrected as shown below:

Column 5, line 3, delete "5 parts" and insert --50 parts--;

Column 5, Table 2, delete "$NaCl_2$" and insert --$NiCl_2$--;

Column 6, line 27, delete "0.2 $g/cm^2$" and insert --0.2 $g/cm^3$--.

Signed and Sealed this

First Day of July, 1997

Attest:

BRUCE LEHMAN

*Attesting Officer*   *Commissioner of Patents and Trademarks*